United States Patent [19]

Kobayashi et al.

[11] Patent Number: 5,077,651
[45] Date of Patent: Dec. 31, 1991

[54] SNUBBER CIRCUIT OF POWER CONVERTER

[75] Inventors: Shinichi Kobayashi, Matumoto; Masakazu Yoshida, Koube; Hiromu Takubo, Mitaka, all of Japan

[73] Assignee: Fuji Electric Co., Ltd., Japan

[21] Appl. No.: 585,723

[22] Filed: Sep. 19, 1990

[30] Foreign Application Priority Data

Sep. 20, 1989 [JP] Japan .................................. 1-243683

[51] Int. Cl.[5] .......................................... H02M 7/122
[52] U.S. Cl. .................................... 363/56; 363/132
[58] Field of Search ...................... 363/55, 56, 57, 58, 363/132, 137

[56] References Cited

U.S. PATENT DOCUMENTS

| | | | |
|---|---|---|---|
| 3,508,140 | 4/1970 | Moses | 307/318 |
| 4,095,163 | 6/1978 | Montague | 307/318 |
| 4,520,279 | 5/1985 | Glennon | 318/519 |
| 4,611,267 | 9/1986 | McMurray | 363/58 |
| 4,794,508 | 12/1988 | Carroll | 363/95 |
| 4,853,836 | 8/1989 | Furuhashi | 363/58 |
| 4,890,210 | 12/1989 | Myers | 363/21 |
| 4,906,857 | 3/1990 | Cummins et al. | 361/29 |

FOREIGN PATENT DOCUMENTS

WO8809085 11/1988 Int'l Pat. Institute .
133988 10/1981 Japan .
1178029 1/1970 United Kingdom .

OTHER PUBLICATIONS

IEEE Transactions of Industrial Electronics; vol. IE-33, No. 2, May 31, 1986, N.Y., U.S. pp. 185–192, K. S. Rajashekara et al. "Protection and Switching-Aid Networks for Transistor Bridge Inverters".

Primary Examiner—Jeffrey L. Sterrett
Attorney, Agent, or Firm—Brumbaugh, Graves, Donohue & Raymond

[57] ABSTRACT

A power converter section in which two serially connected snubber circuits, each formed by an asymmetrical element, such as a Zenner diode and a capacitor in series, and an auxiliary snubber circuit including a third capacitor coupled across parts of the first two snubber circuits, is disclosed. The described power converter section reduces the number of components and cost necessary for increasing surge voltage suppression.

16 Claims, 2 Drawing Sheets

SNUBBER CIRCUIT OF POWER CONVERTER

BACKGROUND OF THE INVENTION

The present invention relates to a snubber circuit for protecting self-arc-extinguishing type power semiconductor elements forming a power converter such as an inverter, and more particularly to a simplified snubber circuit for a power converter.

FIG. 4 shows a circuit diagram of a typical power converter. The same or corresponding parts have been labelled with the same reference numerals in subsequent drawings. This circuit is used in an inverter for driving a motor, and in an uninterruptive power supply and the like. The diagram illustrates a circuit in which self turn off semiconductor elements such as power transistors are used as self-arc-extinguishing type power semiconductor elements. In FIG. 4, free-wheeling diodes 4 (41, 42) are usually connected in parallel to power transistors 3 (31, 32), respectively, and the transistor 32 is in a non-conducting state when the transistor 31 is conducting. Under such a state, an electric current is applied to an inductance 8 and a resistance 9 forming a load from a d.c. power supply 1 through the transistor 31. When the transistor 31 turns OFF under this state, the electric current which has been applied t the transistor 31 is coupled to the free-wheeling diode 42 and the load current is kept constant. At this time, charge and discharge type R-C-D snubber circuits 10 and a clamp type R-C-D snubber circuit 11 such as shown in FIG. 4 are connected for the purpose of reducing a surge voltage generated by energy stored in a floating inductance 2 by means of wirings from the capacitor of the d.c. power supply 1 to the transistors 3.

With further reference to those snubber circuits, the charge and discharge type snubber circuits 10 connected in parallel to the transistors 3 are used for the purpose of controlling dv/dt so as to reduce the turn-off duty of the elements, and the clamp type snubber circuit 11 connected across both ends of the d.c. power supply 1 is used for the purpose of absorbing energy stored in the floating inductance 2 of a power supply feeder line. Sometimes a driving circuit of the semiconductor element 3 or a control circuit of the power converter malfunctions due to an excessive vibration or oscillation voltage generated at the time of reverse recovery of snubber diodes SD in these snubber circuits 10 and 11. For the purpose of preventing such malfunctions from occurring, R-C snubbers 12, each consisting of a series circuit of a resistor and a capacitor, are connected to snubber diodes SD as shown in FIG. 4.

In the power converter shown in FIG. 4, however, the snubber circuit is complicated and expensive as a result of the numerous components required.

With the spread in the use of inverters it is an object of the present invention to reduce the necessary components further for the purpose of cost reduction and improvement of reliability of the inverter.

It is an object of the present invention to simplify the composition of a snubber circuit attached to a self-arc-extinguishing type power semiconductor element so as to reduce the quantity of components and to form a more compact power converter.

SUMMARY OF THE INVENTION

In order to solve above-described problems, a circuit according to the present invention is a snubber circuit of a power converter in which a plurality of series circuits of self-arc-extinguishing type power semiconductor elements such as a transistor are connected across a d.c. power supply. A series circuit, including a first snubber capacitor, such as a charge and discharge snubber capacitor, and a constant voltage diode coupled in a forward direction with respect to the d.c. power supply (referred to as a charge and discharge snubber circuit hereafter), is connected in parallel to each of the respective semiconductor elements. The constant voltage diode in each charge and discharge snubber circuit which is in contact with the positive pole or the negative pole or both of these poles of the d.c. power supply is disposed on the positive pole side or negative pole side of the d.c. power supply. A second snubber capacitor such as a clamp snubber capacitor is connected between the cathode of the constant voltage diode disposed on the positive pole side and the negative pole, or between the anode of the constant voltage diode disposed on the negative pole side and the positive pole, or between the cathode and the anode. One or more charge and discharge type snubber constant voltage diodes are formed in common with a clamp type snubber constant voltage diode.

BRIEF DESCRIPTION OF THE DRAWINGS

The above and further advantages of the invention will be better understood with respect to the following detailed description of a preferred embodiment, taken in combination with the several figures of the associated drawings in which.

DESCRIPTION OF PREFERRED EMBODIMENTS

Embodiments of the present invention will be described hereafter with reference to FIG. 1 through FIG. 3.

Figure 1:
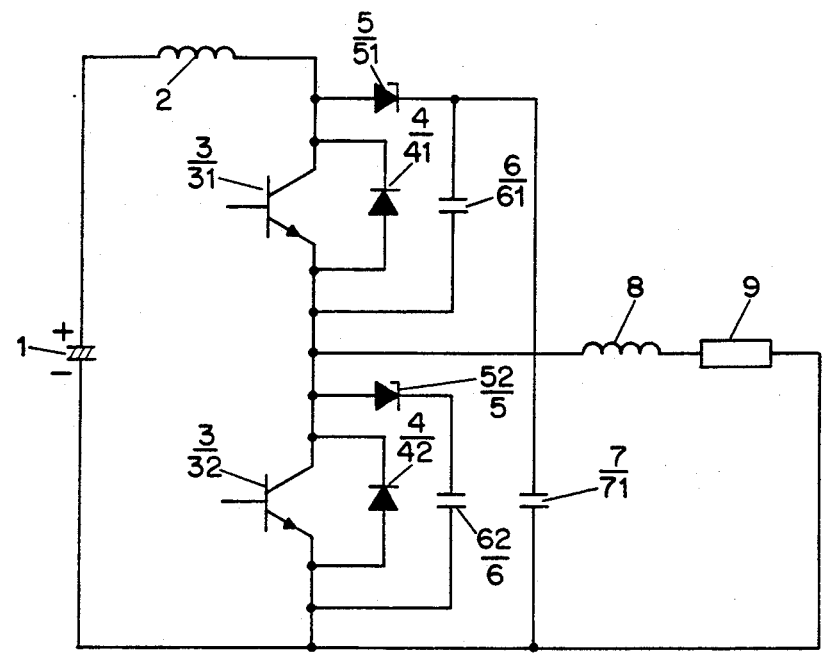
FIG. 1 is a circuit diagram showing a first embodiment of the present invention.

FIG. 1 is a circuit diagram showing a first embodiment of the present invention. In FIG. 1, electric charge storage devices shown as capacitors 6 (61, 62) connected to constant voltage diodes shown as Zener diodes 51 and 52 function to control dv/dt generated by respective semiconductor elements shown as transistors 31 and 32. An auxiliary snubber circuit shown as capacitor 7 (71) functions to reduce a surge voltage generated by a floating inductance 2 of a power supply feeder line. The constant voltage diode 51 consumes energy when these two capacitors 61 and 71 discharge so as to cease resonance phenomena.

Figure 2:
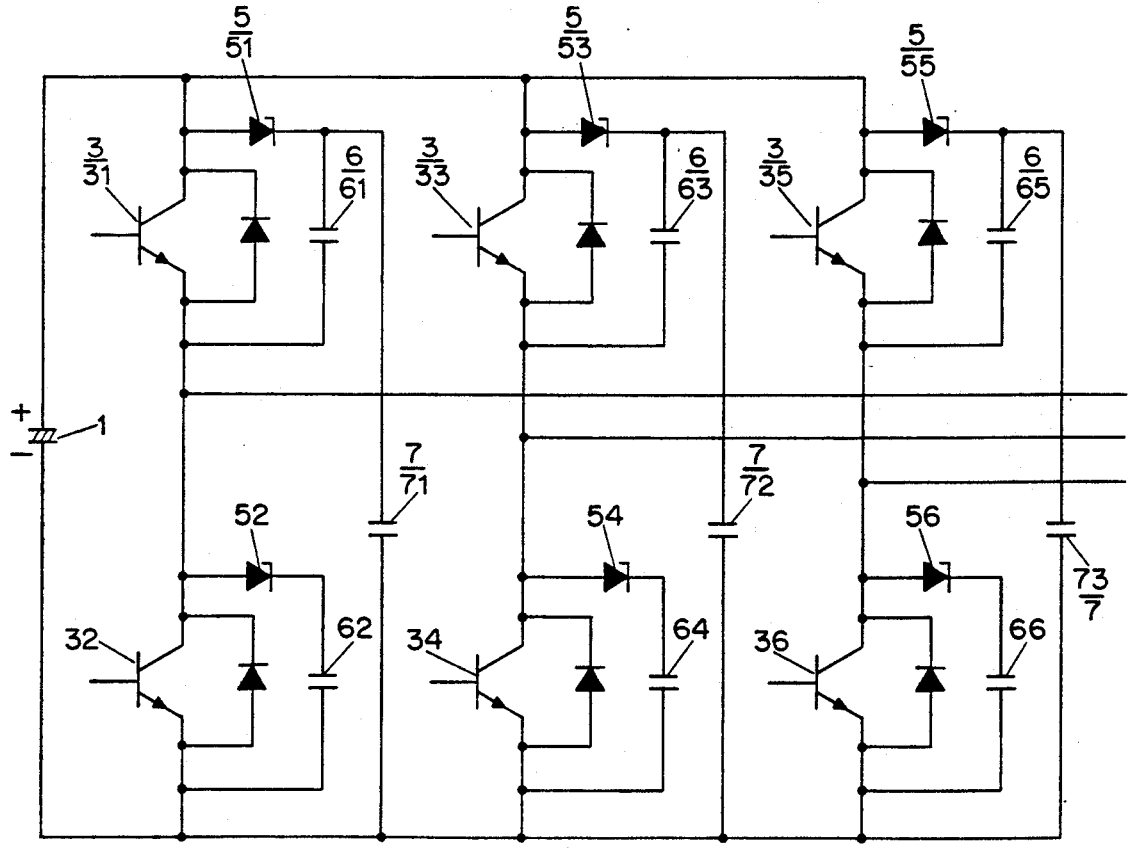
FIG. 2 is a circuit diagram in which the circuit shown in FIG. 1 is applied to a three-phase inverter.

FIG. 2 shows an example of applying the circuit of FIG. 1 to a three-phase inverter circuit. The function of the snubber circuit is the same as that shown in FIG. 1.

Figure 3:
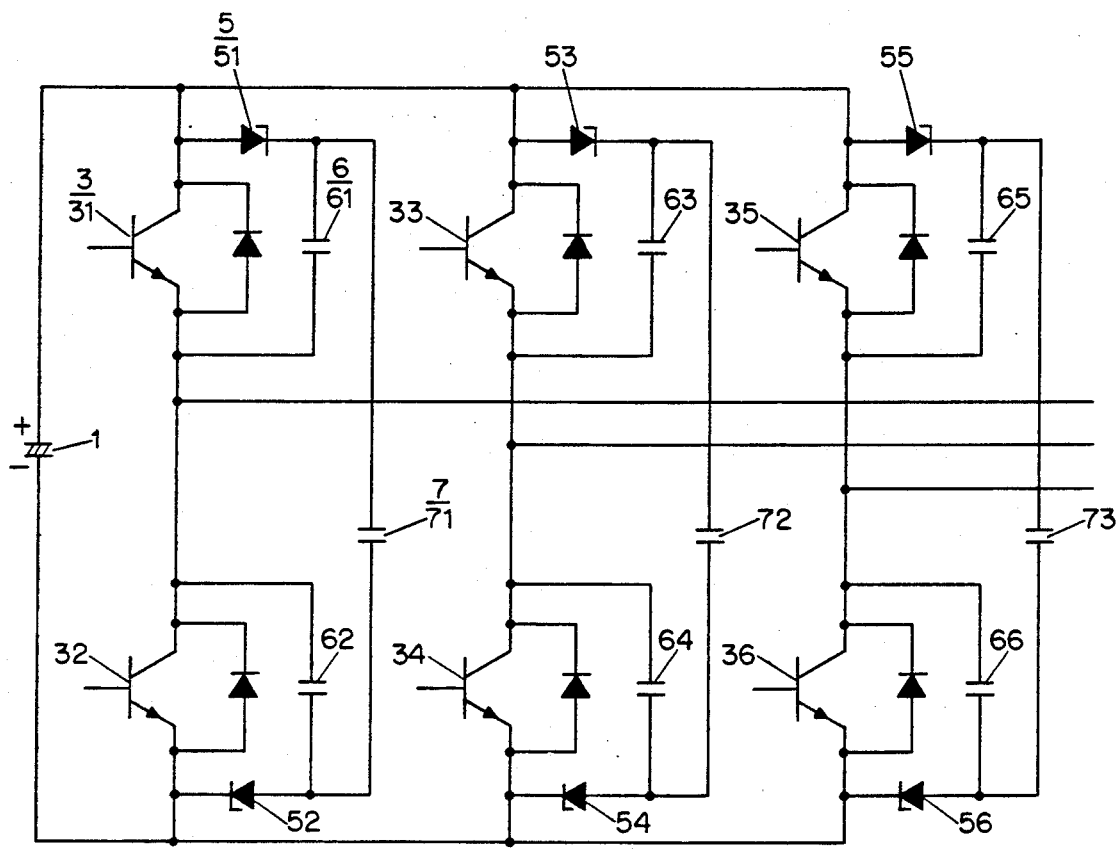
FIG. 3 is a circuit diagram showing a second embodiment of the present invention.
Figure 4:
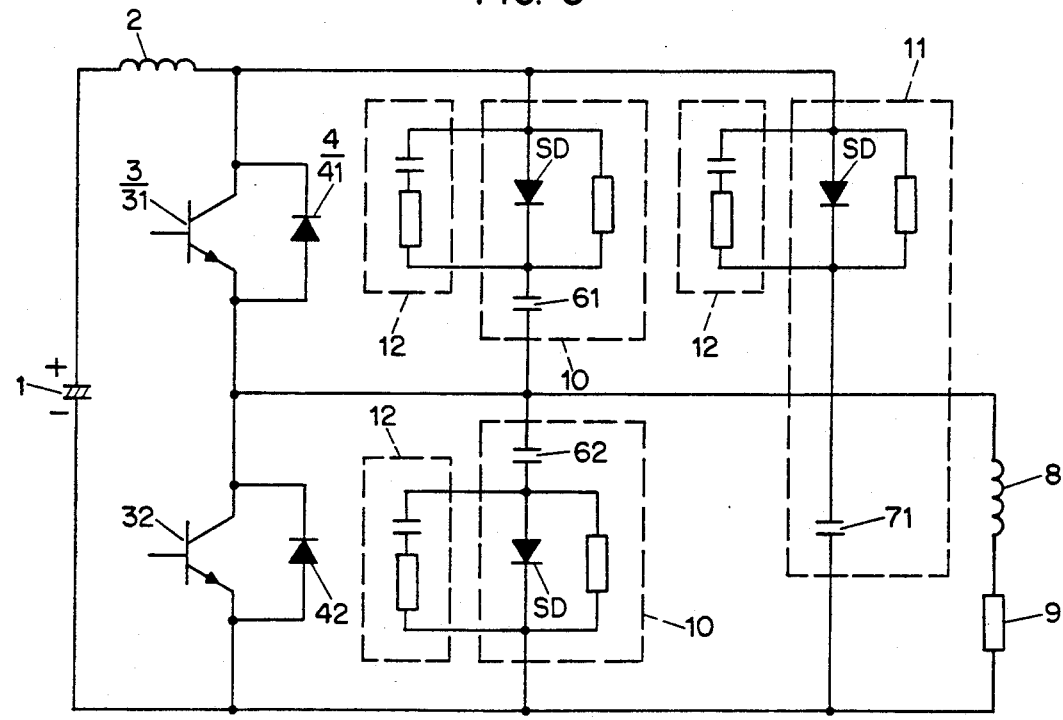
FIG. 4 is a circuit diagram showing a conventional snubber circuit corresponding to FIG. 1.

FIG. 3 shows a second embodiment of the present invention. In FIG. 3, the Zener diodes 51 and 52 are designed to take over an equal portion of the function of the Zener diode 51 in FIG. 1. In the embodiment shown in FIG. 1, the energy of two similar capacitors 61 and 71 have to be dissipated by the constant voltage diode 51 on one side. In the embodiment shown in FIG. 3, however, the energy of the clamp type snubber capacitor 71 may be dissipated by means of two constant voltage diodes 51 and 52. Further, since the electric current applied to the capacitor 7 is usually larger than the electric current applied to the capacitor 6, it increases the Zener voltage in order to attenuate the resonance electric current of the capacitor 7. In the embodiment shown in FIG. 3, however, since two similar constant voltage diodes 5 are connected in series with the capacitor 7, the same effect is obtainable as if the Zener voltage had been doubled.

In addition to the above-described embodiment, a circuit in which the terminals on the upper sides of the clamp type snubber capacitors 7 (71, 72, 73) in FIG. 3 bypass the Zener diodes 5 (51, 53, 55), respectively, and are connected to a positive pole of the d.c. power supply 1 to result in a FIG. 2 type circuit, may be considered. This circuit merely exchanges the functions of the constant voltage diodes 51 and 52. Such circuit variations will be apparent to those skilled in the art in application of the present invention.

The above-described respective embodiments of the present invention, have described circuits in which a power transistor is used as the self-arc-extinguishing type power semiconductor element, but the present invention is also applicable where an alternative form of self-arc-extinguishing type power semiconductor element such as an insulating gate type bipolar transistor or a field effect transistor is employed in place of the power transistor.

According to the present invention, a snubber circuit formed by connecting an asymmetrical element such as a constant voltage diode in series with a capacitor is connected in parallel with each individual self-arc-extinguishing power semiconductor element forming a power converter. The auxiliary snubber circuit is connected between positive and negative poles of the power converter and a constant voltage diode of the snubber circuit serves also as a constant voltage diode for an auxiliary snubber circuit between positive and negative poles. Accordingly, it is possible to reduce the number of components and simplify the circuit. Also, because the snubber circuit between positive and negative poles is installed close to the power semiconductor element, it is possible to reduce the inductance of the snubber circuit, thus increasing the surge voltage suppression effect.

Although the invention has been illustrated and described herein by reference to a specific embodiment thereof, it will be understood by those skilled in the art that such embodiment is susceptible to modification and variation without departing from the inventive concepts disclosed. All such modification and variations, therefore, are intended to be encompassed within the spirit and scope of the appended claims.

We claim:

1. A power converter section for use in a DC to AC power conversion device, comprising:

first and second self turn off semiconductor elements, arranged for coupling in series across a source of DC power, for alternatively turning on and self turning off in response to control signals;

a first snubber circuit coupled across said first semiconductor element, comprising a first constant voltage semiconductor means coupled in series with a first charge storage means for electric charge storage for reducing voltage transients generated by operation of said first semiconductor element;

a second snubber circuit coupled across said second semiconductor element, comprising a second constant voltage semiconductor means coupled in series with a second charge storage means for electric charge storage for reducing voltage transients generated by operation of said second semiconductor element; and an auxiliary snubber circuit including third means for electric charge storage coupled across the first and second charge storage means and in series with said first constant voltage means, for reducing surge voltage resulting from operation of said semiconductor elements;

whereby, interaction of the snubber circuits and the auxiliary snubber circuit reduces surge voltage and internal resonance characteristics of the power conversion device.

2. A power converter section according to claim 1, wherein the first and second constant voltage semiconductor means are Zener diodes.

3. A power converter section according to claim 1, wherein the auxiliary snubber circuit is coupled from the junction between said first constant voltage semiconductor means and said first charge storage means.

4. A power converter section according to claim 1, wherein the auxiliary snubber circuit is additionally coupled across said second constant voltage semiconductor means.

5. A power converter section according to claim 4, wherein the first and second constant voltage semiconductor means are Zener diodes.

6. A power converter section according to claim 1, wherein the auxiliary snubber circuit in addition to being coupled in series with said first constant voltage means is coupled in series with said second constant voltage means.

7. A power converter section according to claim 6, wherein the first and second constant voltage semiconductor means are Zener diodes.

8. A power converter section according to claim 6, wherein the auxiliary snubber circuit is coupled from the junction between said first constant voltage semiconductor means and said first charge storage means to the junction between said second constant voltage semiconductor means and said second charge storage means.

9. A power converter section according to claim 1, further comprising an output power line coupled at one end to the junction point between the first and second semiconductor elements for providing one phase of AC output.

10. A DC to three phase power conversion device comprising:

three single phase power converter sections, each including:

first and second self turn off semiconductor elements, arranged for coupling in series across a source of DC power, for alternatively turning on and self turning off in response to control signals;

a first snubber circuit coupled across said first semiconductor element, comprising a first constant voltage semiconductor means coupled in series with a first charge storage means for electric charge storage for reducing voltage transients generated by operation of said first semiconductor element;

a second snubber circuit coupled across said second semiconductor element, comprising a second constant voltage semiconductor means coupled in series with a second charge storage means for electric charge storage for reducing voltage transients generated by operation of said second semiconductor element; and an auxiliary snubber circuit including third means for electric charge storage coupled across the first and second charge storage means and in series with said first constant voltage means, for reducing surge voltage resulting from operation of said semiconductor elements;

each of said single phase sections being arranged for a coupling across a source of DC power for providing at the junction point between said first and second semiconductor elements of said sections a signal representing an AC output of said one of three phases in response to a control signal.

11. A power converter section for use in a DC to AC power conversion device, comprising:

first and second self turn off semiconductor elements, arranged for coupling in series across a source of DC power, for alternatively turning on and self turning off in response to control signals;

first and second free wheeling diodes, coupled across said first and second semiconductor elements, respectively, for maintaining a constant load current upon self turn off of said semiconductor elements;

a first snubber circuit, coupled across said first semiconductor element, comprising a first constant voltage semiconductor means coupled in series with a first charge storage means for electric charge storage for reducing voltage transients generated by operation of said first semiconductor element;

a second snubber circuit coupled across said second semiconductor element, comprising a second constant voltage semiconductor means coupled in series with a second charge storage means for electric charge storage for reducing voltage transients generated by operation of said second semiconductor element; and an auxiliary snubber circuit including third means for electric charge storage coupled from the junction between said first constant voltage semiconductor means and said first charge storage means across the first and second means for charge storage to the junction between said second constant voltage semiconductor means and said second means for charge storage, for reducing surge voltage resulting from operation of said semiconductor elements;

whereby, interaction of the snubber circuits and the auxiliary snubber circuit reduces surge voltage and internal resonance characteristics of the power conversion device.

12. A power converter section according to claim 11, wherein said first and second constant voltage semiconductor means are Zener diodes.

13. A DC to three phase AC power conversion device, comprising:

three single phase power converter sections, each including:

first and second self turn off semiconductor elements, arranged for coupling in series across a source of DC power, for alternatively turning on and self turning off in response to control signals;

first and second free wheeling diodes, coupled across said first and second semiconductor elements, respectively, for maintaining a constant load current upon self turn off of said semiconductor elements;

a first snubber circuit, coupled across said first semiconductor element, comprising a first constant voltage semiconductor means coupled in series with a first charge storage means for electric charge storage for reducing voltage transients generated by operation of said first semiconductor element;

a second snubber circuit coupled across said second semiconductor element, comprising a second constant voltage semiconductor means coupled in series with a second charge storage means for electric charge storage for reducing voltage transients generated by operation of said second semiconductor element; and an auxiliary snubber circuit including third means for electric charge storage coupled from the junction between said first constant voltage semiconductor means and said first charge storage means across the first and second means for charge storage to the junction between said second constant voltage semiconductor means and said second means for charge storage, for reducing surge voltage resulting from operation of said semiconductor elements;

each of said single phase sections being arranged for a coupling across a source of DC power for providing at the junction point between the first and second semiconductor elements of said sections a signal representing an AC output of said one of three phases in response to a control signal.

14. A power converter section for use in a DC to AC power conversion device, comprising:

first and second self turn off semiconductor elements, arranged for coupling in series across a source of DC power, for alternatively turning on and self turning off in response to control signals;

first and second free wheeling diodes, coupled across said first and second semiconductor elements, respectively, for maintaining a constant load current self turn off of said semiconductor elements;

a first snubber circuit, coupled across said first semiconductor element, comprising a first constant voltage semiconductor means coupled in series with a first charge storage means for electric charge storage for reducing voltage transients generated by operation of said first semiconductor element;

a second snubber circuit coupled across said second semiconductor element, comprising a second constant voltage semiconductor means coupled in series with a second charge storage mean for electric charge storage for reducing voltage transients generated by operation of said second semiconductor element; and an auxiliary snubber circuit including third means for electric charge storage coupled from the junction between said first constant voltage semiconductor means and said first charge storage means across said first and second means for charge storage and said second constant voltage semiconductor means, for reducing surge voltage resulting from operation of said semiconductor elements;

whereby, interaction of the snubber circuits and the auxiliary snubber circuit reduces surge voltage and internal resonance characteristics of the power conversion device.

15. A power converter section according to claim 14, wherein said first and second constant voltage semiconductor means are Zener diodes.

16. A DC to three phase AC power conversion device, comprising:

three single phase power converter sections, each including:

first and second self turn off semiconductor elements, arranged for coupling in series across a source of DC power, for alternatively turning on and self turning off in response to control signals;

first and second free wheeling diodes, coupled across said first and second semiconductor elements, respectively, for maintaining a constant load current self turn off of said semiconductor elements;

a first snubber circuit, coupled across said first semiconductor element, comprising a first constant voltage semiconductor means coupled in series with a first charge storage means for electric charge storage for reducing voltage transients generated by operation of said first semiconductor element;

a second snubber circuit coupled across said second semiconductor element, comprising a second constant voltage semiconductor means coupled in series with a second charge storage means for electric charge storage for reducing voltage transients generated by operation of said second semiconductor element; and an auxiliary snubber circuit including third means for electric charge storage coupled from the junction between said first constant voltage semiconductor means and said first charge storage means across the first and second means for charge storage and said second constant voltage semiconductor means, for reducing surge voltage resulting from operation of said semiconductor elements;

each of said single phase sections being arranged for a coupling across a source of DC power for providing at the junction point between the first and second semiconductor elements of said sections a signal representing an AC output of said one of three phases in response to a control signal.

* * * * *